(12) United States Patent
Liu et al.

(10) Patent No.: US 7,357,294 B2
(45) Date of Patent: Apr. 15, 2008

(54) METHOD FOR MOUNTING A SEMICONDUCTOR PACKAGE ONTO PCB

(75) Inventors: Pai-Chou Liu, Kaohsiung (TW); Hsin-Fu Chuang, Ciaotou Township, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 264 days.

(21) Appl. No.: 10/942,789

(22) Filed: Sep. 17, 2004

(65) Prior Publication Data

US 2005/0061854 A1    Mar. 24, 2005

(30) Foreign Application Priority Data

Sep. 19, 2003   (TW)   ............... 92126030 A

(51) Int. Cl.
    *B23K 31/02*   (2006.01)
(52) U.S. Cl. ............... 228/180.21; 228/245; 228/248.1
(58) Field of Classification Search ........... 228/180.21; 257/696
    See application file for complete search history.

(56) References Cited

U.S. PATENT DOCUMENTS

| | | | | |
|---|---|---|---|---|
| 4,920,074 A | * | 4/1990 | Shimizu et al. | 29/827 |
| 5,015,206 A | * | 5/1991 | Dennis | 439/876 |
| 5,541,367 A | * | 7/1996 | Swamy | 174/260 |
| RE35,549 E | * | 7/1997 | Seidler | 439/876 |
| 2002/0135727 A1 | * | 9/2002 | Nakaminami et al. | 349/149 |
| 2003/0080083 A1 | * | 5/2003 | Ohara | 216/2 |

FOREIGN PATENT DOCUMENTS

| | | | |
|---|---|---|---|
| JP | 05121868 A | * | 5/1993 |
| JP | 06021629 A | * | 1/1994 |
| TW | 483299 | | 4/2002 |

OTHER PUBLICATIONS

Author Unknown, Derwent-Acc-No. 1998-259129, Publication No. RD-408115-A, Mar. 20, 1998; see clipped figures and application info (2 pages).*

* cited by examiner

*Primary Examiner*—Kiley Stoner
(74) *Attorney, Agent, or Firm*—Troxell Law Office, PLLC

(57) ABSTRACT

A method for mounting a semiconductor package onto PCB includes a semiconductor package comprising a plurality of outer terminals exposed out of an encapsulant. A PCB having a surface with a plurality of contact pads is provided. Each contact pad has a first exposed side, a second exposed side and a center between the exposed sides. A plurality of first pre-solders and second pre-solders are formed on the surface to cover the first and second exposed sides of the contact pads respectively, the centers of the contact pads between the first and second pre-solders being exposed. Then the first and second pre-solders are reflowed and the semiconductor package is mounted on the PCB. When the outer terminals are connected to the contact pads, each first pre-solder and second pre-solder are flowed toward the centers of the contact pad to prevent the fine pitch contact pads from bridging.

11 Claims, 3 Drawing Sheets

METHOD FOR MOUNTING A SEMICONDUCTOR PACKAGE ONTO PCB

FIELD OF THE INVENTION

The present invention relates to a method for mounting a semiconductor package onto PCB, particularly to a method for mounting a semiconductor package onto PCB with pre-solders.

BACKGROUND OF THE INVENTION

A well-known SMT technology is used for mounting a semiconductor package with a plurality of outer terminals on a printed circuit board (PCB). Because of the outer terminals of the semiconductor package become more and more, the pitch of the outer terminals also becomes smaller and smaller. Conventionally all the outer terminals have to mount on the corresponding contact pads of the PCB via solder paste. A plurality of pre-solders are formed on the contact pads prior to SMT processes. When the outer terminals of the semiconductor package are pressed on the pre-solders, the flowing direction of the pre-solders becomes uncontrollable which may easily spread out and cause bridging between two adjacent contact pads.

A method of surface mounting semiconductor package is disclosed in R.O.C. Taiwan Patent No. 483299. A semiconductor package has an exposed die pad. A solder receiving groove is formed on the outside surface of the die pad. A first solder is formed on a ground panel of a printed circuit board (PCB). A plurality of second solders are formed on a plurality of fingers of the PCB. During the reflowing process, the first solder connects the ground panel and die pad, the second solders connect the fingers and the outer leads of the semiconductor package. The solder receiving groove can receive the first solder to avoid solder beads formation and contamination to the outer leads or fingers. However, bridging problems of the second solders between the fingers cannot be solved by means of the solder receiving groove.

SUMMARY

A main object of the present invention is to provide a method for mounting a semiconductor package onto PCB. A plurality of first pre-solders and a plurality of second pre-solders are formed on a printed circuit board (PCB) with a plurality contact pads. The first pre-solders cover the first exposed sides of the contact pads, and the second pre-solders cover the second exposed sides of the contact pads. Spaces between the first pre-solders and the corresponding second pre-solders expose the centers of the contact pads. When the first and second pre-solders are reflowed and a semiconductor package is mounts on the printed circuit board, the first pre-solders and second pre-solders flow toward the centers of the contact pads to prevent bridging problem between adjacent contact pads.

A second object of the present invention is to provide a method for mounting a semiconductor package onto PCB. First and second pre-solders are formed on a printed circuit board (PCB) with a plurality contact pads. The first and second pre-solders covers the two opposing sides of the contact pads and exposes the centers of the contact pads. When the first and second pre-solders are reflowed and a semiconductor package is mounted on the printed circuit board, the outer terminals of the semiconductor package are connected to the contact pads via the first and second pre-solders. The first and second pre-solders can extend onto the solder mask of the PCB without bridging between the contact pads for fine pitch layout, for example, the pitch of the contact pads can be less than 0.3 mm.

According to the present invention, a method for mounting a semiconductor package onto PCB includes several important steps as follows. A semiconductor package and a printed circuit board are provided. The semiconductor package has an encapsulant, a chip inside the encapsulant and a plurality of outer terminals exposed out of the encapsulant. The printed circuit board has a surface with a plurality of contact pads and a solder mask. Each contact pad has a first exposed side, an opposing exposed second side and a center between the first and second exposed sides. A plurality of first pre-solders and a plurality of second pre-solders, and is formed on the surface of the PCB. The first pre-solders cover the first exposed sides, and the second pre-solders cover the second exposed sides. Spaces between the first pre-solders and the corresponding second pre-solders expose the centers of the contact pads. Preferably, the first pre-solders and the second pre-solders can extend onto the solder mask. When the first and second pre-solders are reflowed and the semiconductor package is mounted on the surface of the PCB, each first pre-solder and the corresponding second pre-solder can flow toward the center of corresponding contact pad to prevent bridging problem of adjacent contact pads for the fine pitch layout.

DETAILED DESCRIPTION OF THE PRESENT INVENTION

Figure 1:
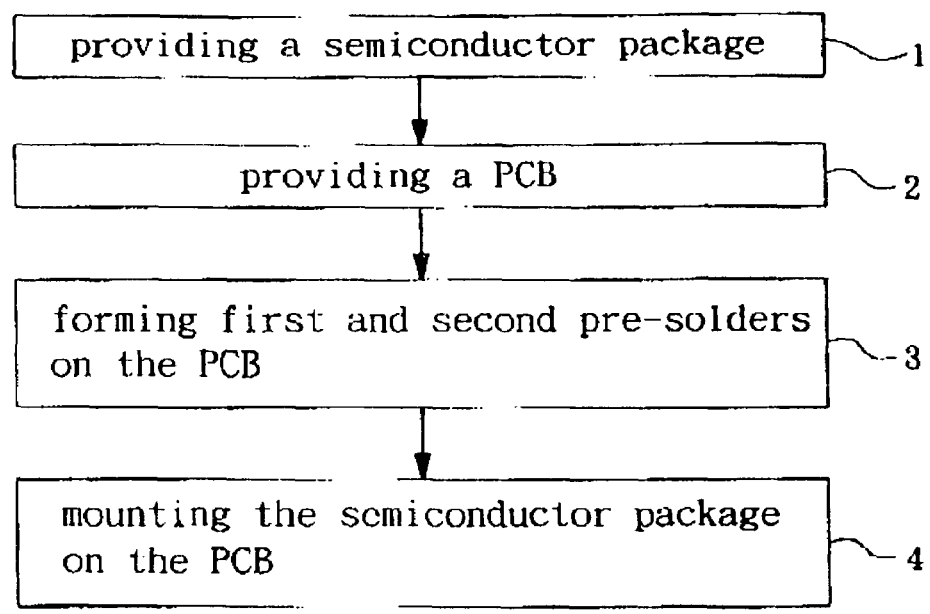
FIG. 1 is a flow chart of a method for mounting a semiconductor package onto PCB in accordance with the embodiment of the present invention.

Referring to the drawings attached, the present invention will be described by means of an embodiment below.

As shown in FIG. 1, a method for mounting a semiconductor package onto PCB is illustrated according to the embodiment of the present invention, which mainly includes step 1 of "providing a semiconductor package", step 2 of "providing a PCB", step 3 of "forming first and second pre-solders on the PCB" and step 4 of "mounting the semiconductor package on the PCB".

Figure 2:
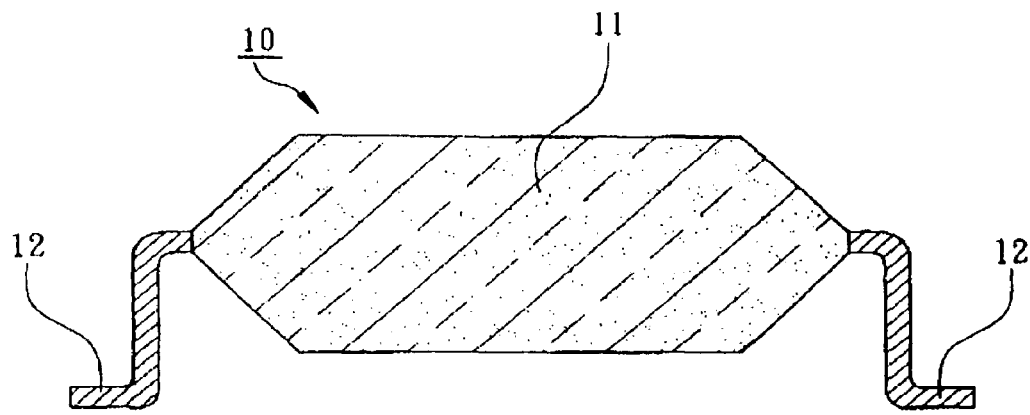
FIG. 2 is a cross-sectional view of a provided semiconductor package in accordance with the embodiment of the present invention.

Referring to FIG. 2, firstly in the step 1, a semiconductor package 10 is provided. The semiconductor package 10 includes an encapsulant 11, a chip inside the encapsulant 11 and a plurality of outer terminals 12 exposed out of the encapsulant 11. The chip inside the encapsulant 11 is electrically connected to the outer terminals 12 (not shown in the figure). The outer terminals 12 are selected from the group consisting of gull leads, J-leads and pads of non-leaded packages. In this embodiment, the semiconductor package 10 is a quad flat package (QFP), and the outer terminals 12 are gull leads. The semiconductor package 10 has high pin count and the outer terminals 12 are arranged in fine pitch. The pitch of the outer terminals 12 can be less than 0.3 mm.

Figure 3:
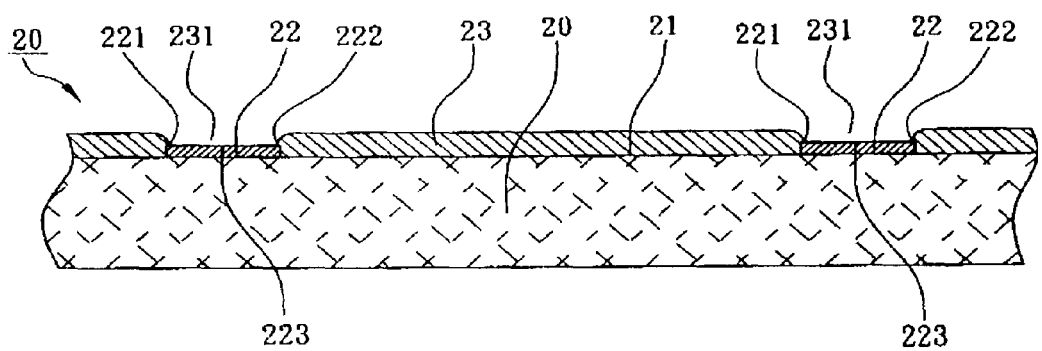
FIG. 3 is a cross-sectional view of a provided printed circuit board in accordance with the embodiment of the present invention.

Referring to FIG. 3, in the step 2, a printed circuit board (PCB) 20 is provided. The printed circuit board 20 may be a motherboard, a communication board or a module substrate. The printed circuit board 20 has a surface 21 for surface mounting. A plurality of contact pads 22 are formed on the surface 21 of the printed circuit board 20 for connecting the outer terminals 12 of the semiconductor package 10. Preferably, a solder mask 23 is formed on the surface 21 of the printed circuit board 20. The solder mask 23 has a plurality of openings 231 at least exposing the contact pads 22. The openings 231 can be aligned with the contact pads 22 to allow the contact pads 22 as SMD (Solder Mask Defined) or NSMD (Non-Solder Mask Defined) pads. Each contact pad 22 has a first exposed side 221, an opposing second exposed side 222 and a center 223 between the first exposed side 221 and the second exposed side 222. The first exposed side 221, the second exposed sides 222 and the centers 223 are exposed out of the solder mask 23. In this embodiment, the first exposed sides 221 are parallel to the corresponding second exposed sides 222. Preferably, the first exposed sides 221 and the corresponding second exposed sides 222 are the two shorter sides of the rectangles, as shown in FIG. 6.

Figure 4:
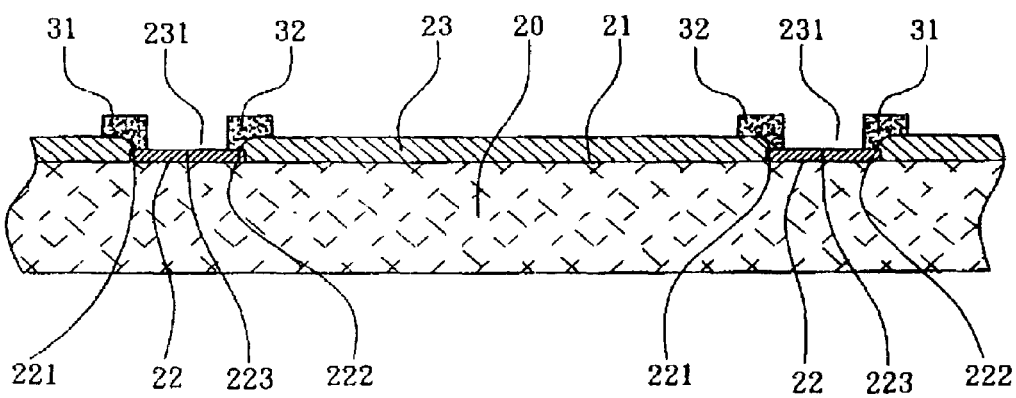
FIG. 4 is a cross-sectional view of the first and second pre-solders formed on the printed circuit board in accordance with the embodiment of the present invention.
Figure 6:
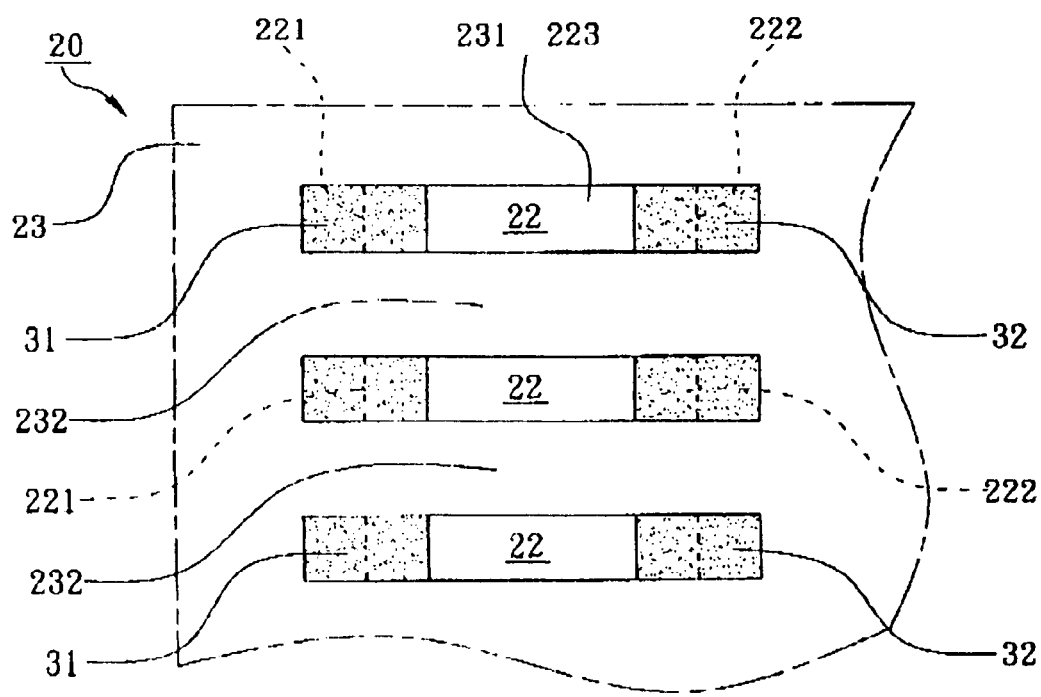
FIG. 6 is a top view of the first and second pre-solders on a printed circuit board in accordance with the embodiment of the present invention.

Referring to FIGS. 4 and 6, in step 3, a plurality of first pre-solders 31 and a plurality of second pre-solders 32 are formed on the printed circuit board 20 in a determined pattern. The first and second pre-solders 31, 32 can be formed by screen-printing or stencil-printing. The first pre-solders 31 cover the first exposed sides 221 of the contact pads 22 and extend onto the solder mask 23. The second pre-solders 32 cover the second exposed sides 222 of the contact pads 22 and extend onto the solder mask 23. Spaces between the first pre-solders 31 and the corresponding second pre-solders 32 expose the centers 223 or the other portions of the contact pads 22. The first and second pre-solders 31, 32 corresponding to each contact pad 22 may have a shape selected from the group consisting of "I I", "H", "X" and "- -". Because the exposed centers 223 are not covered by the first and the second pre-solders 31 and 32, a flowing direction of the first and second pre-solders 31, 32 is provided toward the centers 223 during the mounting step 4. Therefore, the bridging problem between adjacent contact pads 22 is prevented. Besides, the step 3 of "forming first and second pre-solders on the PCB" can be proceeded in the step 2 of "providing a PCB" as a sub-step included in the step 2, i.e., the printed circuit board 20 with the first pre-solders 31 and the second pre-solders 32 is provided in the step 2.

Figure 5:
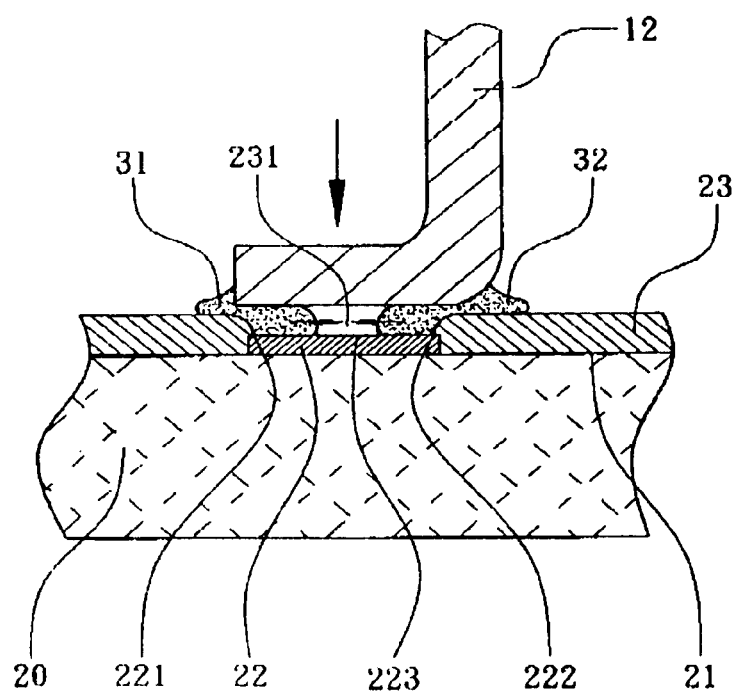
FIG. 5 is an enlarged cross-sectional view of one of the contact pads on the printed circuit board including one of outer terminals of a semiconductor package and the first and second pre-solders during SMT in accordance with the embodiment of the present invention.

Referring to FIGS. 5 and 6, the mounting step 4 is preformed. The semiconductor package 10 is mounted on the surface 21 of the printed circuit board 20. At the same time, the first and second pre-solders 31, 32 are reflowed. The outer terminals 12 of the semiconductor package 10 are connected to the contact pads 22 via the first and second pre-solders 31, 32 in specific pattern. The first pre-solders 31 and the second pre-solders 32 are pressed by the outer terminals 12 then heated so as to flow toward the corresponding centers 223 of the contact pads 22. The first pre-solders 31 and the second pre-solders 32 are connected to each other at the centers 223 on the corresponding contact pads 22 during the reflowing. The first pre-solders 31 and the second pre-solders 32 are under control and can not spread out of the solder mask 23, so there is no bridging problems between the adjacent contact pads 22. In addition, the shape of the first and second pre-solders 31, 32 and the locations of the exposed portions of the contact pads 22 out of the first and second pre-solders 31, 32 at the centers 223 are not limited, i.e., the contact pads 22 can have various exposed portions out of the first and second pre-solders 31, 32 to control the flowing direction of the first and second pre-solders 31, 32. Besides, the contact pads 22 may be in circular or elliptic shape (not shown in the figure), and the first pre-solders 31 and the second pre-solders 32 can be connected together in various solder patterns. Using the first and second pre-solders 31, 32 on the solder mask 23 to expose the predetermined portions of the contact pads 22, the bridging problem between adjacent contact pads 22 can be prevented when the semiconductor package 10 is mounted on the surface 21 of the printed circuit board 20 with fine pitch contact pads 22.

The above description of embodiments of this invention is intended to be illustrated but not limited. Other embodiments of this invention will be obvious to those skilled in the art in view of the above disclosure.

What is claimed is:

1. A method for mounting a semiconductor package onto a PCB comprising:
   providing said semiconductor package including an encapsulant, a chip inside the encapsulant and a plurality of outer terminals exposed out of the encapsulant;
   providing said printed circuit board having a surface with a plurality of contact pads for connecting the outer terminals, each contact pad has a first exposed side, an opposing exposed second side and a center between the first and second exposed sides;
   forming a plurality of first pre-solders and a plurality of second pre-solders on the surface of the printed circuit board such that the first pre-solders cover the first exposed sides, the second pre-solders cover the second exposed sides, a plurality of spaces are formed between the first pre-solders and the corresponding second pre-solders to expose the centers of the contact pads; and
   reflowing the first and second pre-solders and mounting the semiconductor package on the surface of the printed circuit board such that the outer terminals are connected to the contact pads via the first and second pre-solders,
   wherein both the first pre-solders and the second pre-solders are pressed by the outer terminals and, then, both the first pre-solders and the second pre-solders are heated so as to flow toward the corresponding centers of each of the contact pads.

2. The method in accordance with claim 1, wherein the printed circuit board includes a solder mask on the surface, the solder mask has a plurality of openings exposing the contact pads.

3. The method in accordance with claim 2, wherein the first pre-solders and the second pre-solders extend onto the solder mask.

4. The method in accordance with claim 2, wherein the first pre-solders and the second pre-solders are connected to each other on the corresponding contact pads during reflowing.

5. The method in accordance with claim 1, wherein each first exposed side is parallel to the corresponding second exposed side.

6. The method in accordance with claim 1, wherein the first exposed sides and the corresponding second exposed sides are two shorter sides of a rectangle.

7. The method in accordance with claim 1, wherein the first and second pre-solders are formed by one single printing.

8. The method in accordance with claim 1, wherein the outer terminals are selected from the group consisting of gull leads, J-leads and pads of non-leaded packages.

9. The method in accordance with claim 1, wherein the semiconductor package is a quad flat package.

10. The method in accordance with claim 1, wherein the pitch of the contact pads is less than 0.3 mm.

11. The method in accordance with claim 1, wherein the first and second pre-solders are formed in the providing step of the printed circuit board.

* * * * *